United States Patent
Tanaka

(10) Patent No.: US 9,446,939 B2
(45) Date of Patent: Sep. 20, 2016

(54) FUNCTIONAL ELEMENT, ELECTRONIC APPARATUS, AND MOVING OBJECT

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/305,259

(22) Filed: Jun. 16, 2014

(65) Prior Publication Data

US 2014/0367806 A1    Dec. 18, 2014

(30) Foreign Application Priority Data

Jun. 17, 2013    (JP) ................................ 2013-126280

(51) Int. Cl.
*B81B 3/00* (2006.01)
*B81B 7/00* (2006.01)

(52) U.S. Cl.
CPC .......... *B81B 3/0097* (2013.01); *B81B 7/0006* (2013.01); *B81B 2201/0235* (2013.01); *B81B 2201/0242* (2013.01); *B81B 2201/0285* (2013.01)

(58) Field of Classification Search
USPC ........................................................ 257/415
See application file for complete search history.

(56) References Cited

U.S. PATENT DOCUMENTS

| 5,517,754 | A | * | 5/1996 | Beilstein et al. | ............... 29/840 |
| 5,574,222 | A | | 11/1996 | Offenberg | |
| 6,240,782 | B1 | | 6/2001 | Kato et al. | |
| 6,568,267 | B2 | | 5/2003 | Chida et al. | |
| 2009/0256260 | A1 | * | 10/2009 | Nakamura | ..................... 257/758 |
| 2011/0095289 | A1 | * | 4/2011 | Sasaki et al. | .................... 257/48 |
| 2011/0210408 | A1 | * | 9/2011 | Otsuki | .......................... 257/415 |
| 2012/0111615 | A1 | | 5/2012 | Yoda et al. | |
| 2014/0367806 | A1 | * | 12/2014 | Tanaka | ........................... 257/415 |

FOREIGN PATENT DOCUMENTS

| JP | 2001-330442 A | 11/2001 |
| JP | 2007-279056 A | 10/2007 |
| JP | 2012-098208 A | 5/2012 |

* cited by examiner

*Primary Examiner* — Thao P Le
(74) *Attorney, Agent, or Firm* — Harness, Dickey & Pierce, P.L.C.

(57) ABSTRACT

A functional element includes a first electrode section, a second electrode section, a first wiring line connected to the first electrode section, and a second wiring line connected to the second electrode section, the first wiring line is provided with at least one first intersecting section intersecting with a wiring line other than the second wiring line, the second wiring line includes at least one second intersecting section intersecting with a wiring line other than the first wiring line, and a difference between a number of the first intersecting sections and a number of the second intersecting sections satisfies a condition one of equal to and lower than 50% with respect to larger one of the number of the first intersecting sections and the number of the second intersecting sections.

26 Claims, 12 Drawing Sheets

FIG. 8

FUNCTIONAL ELEMENT, ELECTRONIC APPARATUS, AND MOVING OBJECT

CROSS-REFERENCE TO RELATED APPLICATIONS

This application claims priority to Japanese Patent Application No. 2013-126280 filed on Jun. 17, 2013. The entire disclosure of Japanese Patent Application No. 2013-126280 is hereby incorporated herein by reference.

BACKGROUND

1. Technical Field

The present invention relates to a functional element, an electronic apparatus, and a moving object.

2. Related Art

In recent years, there have been developed a physical quantity sensor (a functional element) for detecting a physical quantity such as acceleration using, for example, a silicon MEMS (micro-electromechanical systems) technology.

For example, in JP-A-2012-98208 (Document 1), there is described a physical quantity sensor including a movable body disposed above a substrate, a movable electrode section extending from the movable body, a first stationary electrode section disposed on one side of the movable electrode section, and a second stationary electrode section disposed on the other side of the movable electrode, and separately measuring the capacitance between the movable electrode section and the first stationary electrode section and the capacitance between the movable electrode section and the second stationary electrode section, then detecting the physical quantity based on these measurement results (using a so-called differential detection method).

In such a physical quantity sensor, the capacitances between the stationary electrode sections and the movable electrode section are detected using a first pad connected to the first stationary electrode section via a first wiring line and a second pad connected to the second stationary electrode section via a second wiring line.

However, in the physical quantity sensor of Document 1, the number of the portions of the first wiring line intersecting with the second stationary electrode section and the number of the portions of the second wiring line intersecting with the first stationary electrode section are significantly different from each other. Therefore, in the physical quantity sensor of Document 1, there is a significant difference in electrical characteristics (resistance and parasitic capacitance) between the first wiring line and the second wiring line. Therefore, the parasitic capacitances different from each other are added respectively to the capacitance between the movable electrode section and the first stationary electrode section and the capacitance between the movable electrode section and the second stationary electrode section, and thus, there is a possibility that the detection accuracy of the physical quantity is degraded.

SUMMARY

An advantages of some aspects of the invention is to provide a functional element capable of inhibiting the detection accuracy of a physical quantity from degrading. Further, another of the advantages of some aspects of the invention is to provide an electronic apparatus and a moving object including the functional element described above.

The invention can be implemented as the following forms or application examples.

Application Example 1

A functional element according to this application example includes a first electrode section, a second electrode section, a first wiring line connected to the first electrode section, and a second wiring line connected to the second electrode section, the first wiring line is provided with at least one first intersecting section intersecting with a wiring line other than the second wiring line, the second wiring line includes at least one second intersecting section intersecting with a wiring line other than the first wiring line, and a difference between a number of the first intersecting sections and a number of the second intersecting sections satisfies a condition one of equal to and lower than 50% with respect to larger one of the number of the first intersecting sections and the number of the second intersecting sections.

In such a functional element, the error of the parasitic capacitance between the wiring lines of the functional element can be reduced. For example, in the case of using the functional element for the capacitance detection physical quantity sensor, the difference in additional amount of the capacitance generated between the first wiring line and the second wiring line is reduced. Therefore, in such a physical quantity sensor, a large proportion of the parasitic capacitance of the first wiring line and the second wiring line can be canceled out using a so-called differential detection method, and thus, the physical quantity can more accurately be detected.

Application Example 2

The functional element according to the application example described above may be configured such that a difference between a total sum of intersection areas of the first intersecting sections and a total sum of intersection areas of the second intersecting sections satisfies a condition one of equal to and lower than 50% with respect to larger one of the total sum of the intersection areas of the first intersecting sections and the total sum of the intersection areas of the second intersecting sections in a planar view.

In such a functional element, the error of the parasitic capacitance between the wiring lines of the functional element can be reduced. For example, in the case of using the functional element for the capacitance detection physical quantity sensor, the difference in additional amount of the capacitance generated between the first wiring line and the second wiring line is reduced. Therefore, in such a physical quantity sensor, a large proportion of the parasitic capacitance of the first wiring line and the second wiring line can be canceled out using a so-called differential detection method, and thus, the physical quantity can more accurately be detected.

Application Example 3

The functional element according to the application example described above may be configured such that a number of the first intersecting sections and a number of the second intersecting sections are equal to each other.

In such a functional element, the error of the parasitic capacitance between the wiring lines of the functional element can be reduced. The functional element can more accurately detect the physical quantity in particular as a capacitance detection physical quantity sensor.

Application Example 4

A functional element according to this application example includes a first electrode section, a second electrode section, a first wiring line connected to the first electrode section, and a second wiring line connected to the second electrode section, the first wiring line is provided with at least one first intersecting section intersecting with a wiring line other than the second wiring line, the second wiring line includes at least one second intersecting section intersecting with a wiring line other than the first wiring line, and a difference between a total sum of intersection areas of the first intersecting sections and a total sum of intersection areas of the second intersecting sections satisfies a condition one of equal to and lower than 50% with respect to larger one of the total sum of the intersection areas of the first intersecting sections and the total sum of the intersection areas of the second intersecting sections in a planar view.

In such a functional element, the error of the parasitic capacitance between the wiring lines of the functional element can be reduced. For example, in the case of using the functional element for the capacitance detection physical quantity sensor, the difference in additional amount of the capacitance generated between the first wiring line and the second wiring line is reduced. Therefore, in such a physical quantity sensor, a large proportion of the parasitic capacitance of the first wiring line and the second wiring line can be canceled out using a so-called differential detection method, and thus, the physical quantity can more accurately be detected.

Application Example 5

The functional element according to the application example described above may be configured such that the total sum of the intersection areas of the first intersecting sections is equal to the total sum of the intersection areas of the second intersecting sections.

In such a functional element, the error of the parasitic capacitance between the wiring lines of the functional element can be reduced. The functional element can more accurately detect the physical quantity in particular as a capacitance detection physical quantity sensor.

Application Example 6

The functional element according to the application example described above may be configured such that a number of the first intersecting sections and a number of the second intersecting sections are equal to each other.

In such a functional element, the error of the parasitic capacitance between the wiring lines of the functional element can be reduced. The functional element can more accurately detect the physical quantity in particular in a capacitance detection physical quantity sensor.

Application Example 7

The functional element according to the application example described above may be configured such that a movable body, which can be displaced along a first axis, a first movable electrode section extending from the movable body, and a stationary electrode section including a first stationary electrode section as a first electrode section disposed on one side of the first movable electrode section, and a second stationary electrode section as a second electrode section disposed on the other side are further included.

Such a functional element can be made to function as the capacitance detection physical quantity sensor.

Application Example 8

The functional element according to the application example described above may be configured such that a third wiring line connected to the first movable electrode section is further included, and the third wiring line intersects with at least one of the first wiring line and the second wiring line.

In such a functional element, since it is possible to make, for example, the wiring line connected to the stationary electrode section and the wiring line connected to the movable electrode section intersect with each other, the flexibility of the wiring layout is enhanced.

Application Example 9

The functional element according to the application example described above may be configured such that a fourth wiring line floating electrically is further included, and the fourth wiring line intersects with at least one of the first wiring line and the second wiring line.

In such a functional element, since the number of the intersections can be made equal between the first wiring line and the second wiring line by preparing the fourth wiring line as a dummy wiring line, and making the fourth wiring line intersect with at least one of the first wiring line and the second wiring line, the physical quantity can more accurately be detected.

Application Example 10

The functional element according to the application example described above may be configured such that a second movable electrode section extending on an opposite side to the first movable electrode section is further included, the stationary electrode section includes a third stationary electrode section disposed on one side of the second movable electrode section, and a fourth stationary electrode section disposed on the other side, the first wiring line is connected to the first stationary electrode section and the third stationary electrode section via a first branch section, and the second wiring line is connected to the second stationary electrode section and the fourth stationary electrode section via a second branch section.

In such a functional element, in the physical quantity sensor of the type having the movable electrode extending on both sides of the movable body for improving the sensitivity, it becomes possible to dispose the wiring lines symmetrically by providing the branch sections respectively to the first wiring line and the second wiring line, and thus, the influence of the mismatch in the electrical characteristics caused by the difference in wiring length between the first wiring line and the second wiring line can be reduced.

Application Example 11

The functional element according to the application example described above may be configured such that the movable body, the movable electrode section, the stationary electrode section, the first wiring line, and the second wiring line are disposed on a substrate, and in at least one of the first intersecting section and the second intersecting section, one of the wiring lines intersecting with each other is disposed inside a groove disposed on the substrate.

In such a functional element, the intersecting section between the first wiring line and the second wiring line can easily be constituted.

Application Example 12

The functional element according to the application example described above may be configured such that the other of the wiring lines intersecting with each other is disposed with a structure including silicon.

In such a functional element, the intersecting section between the first wiring line and the second wiring line can easily be constituted.

Application Example 13

The functional element according to the application example described above may be configured such that the first wiring line and the second wiring line are provided with parts disposed in parallel to each other, and in the parts disposed in parallel to each other, one of the first wiring line and the second wiring line is disposed inside a groove disposed on the substrate.

In such a functional element, in the parts of the first wiring line and the second wiring line extending in parallel to each other, the parasitic capacitance between the first wiring line and the second wiring line can be reduced.

Application Example 14

The functional element according to the application example described above may be configured such that the first wiring line and the second wiring line are the same in electrical characteristics as each other.

In such a functional element, by making the first wiring line and the second wiring line the same in electrical characteristics, detection with higher sensitivity can be achieved.

Application Example 15

An electronic apparatus according to this application example includes the functional element according to any one of Application Examples 1 through 12.

In such an electronic apparatus, since the functional element according to any one of the application examples described above, in the case of using the functional element as the capacitance detection physical quantity sensor, the physical quantity can accurately be detected.

Application Example 16

A moving object according to this application example includes the functional element according to any one of Application Examples 1 through 12.

In such a moving object, since the functional element according to any one of the application examples described above, in the case of using the functional element as the capacitance detection physical quantity sensor, the physical quantity can accurately be detected.

BRIEF DESCRIPTION OF THE DRAWINGS

The invention will be described with reference to the accompanying drawings, wherein like numbers reference like elements.

FIG. 8 is a plan view schematically showing a functional element according to a modified example of the second embodiment.

DESCRIPTION OF EXEMPLARY EMBODIMENTS

Hereinafter, some preferred embodiments of the invention will be explained in detail with reference to the accompanying drawings. It should be noted that the embodiment described below does not unreasonably limit the contents of the invention as set forth in the appended claims. Further, all of the constituents explained hereinafter are not necessarily essential elements of the invention.

1. First Embodiment 1.1. Functional Element

Figure 1:
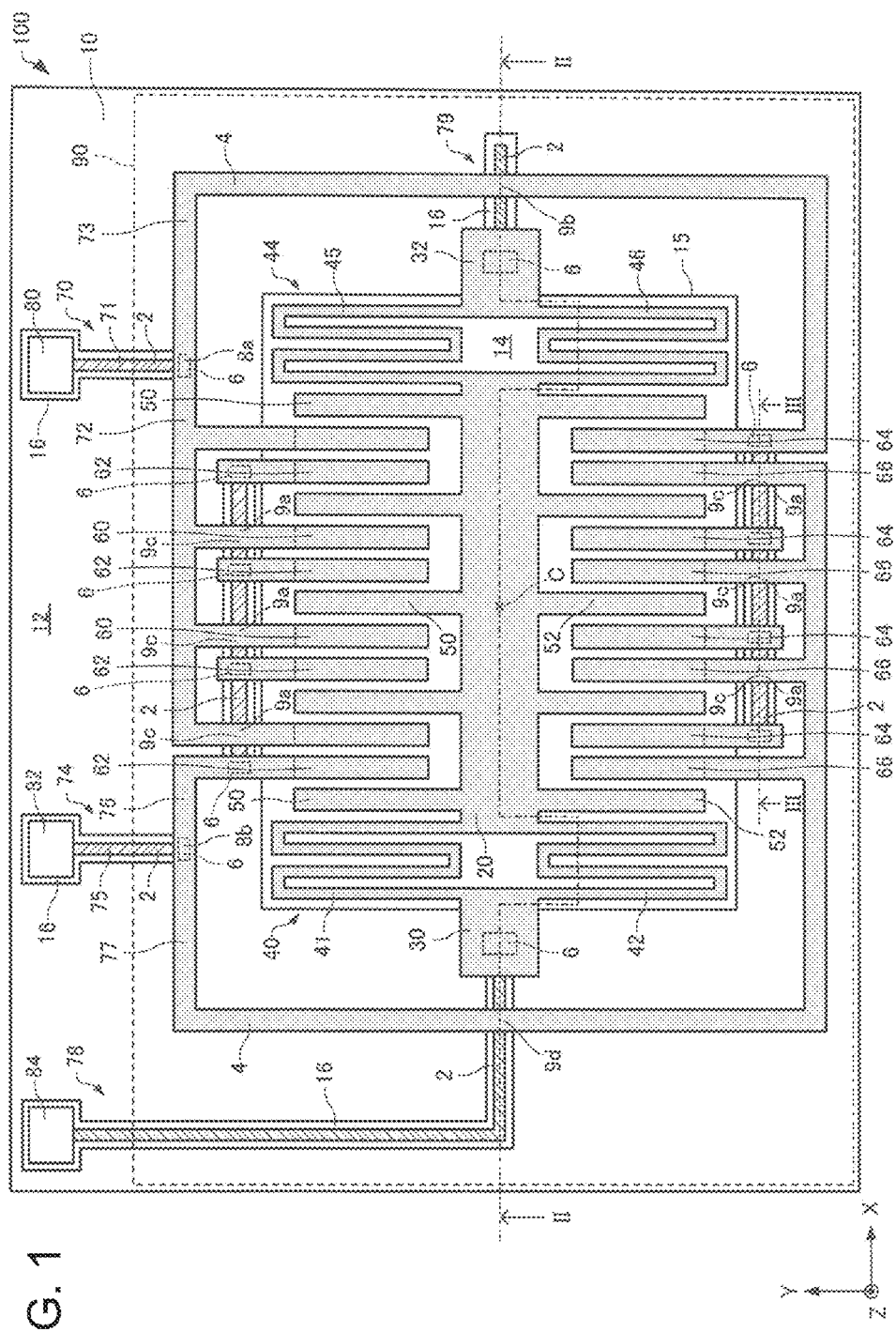
FIG. 1 is a plan view schematically showing a functional element according to a first embodiment of the invention.
Figure 2:
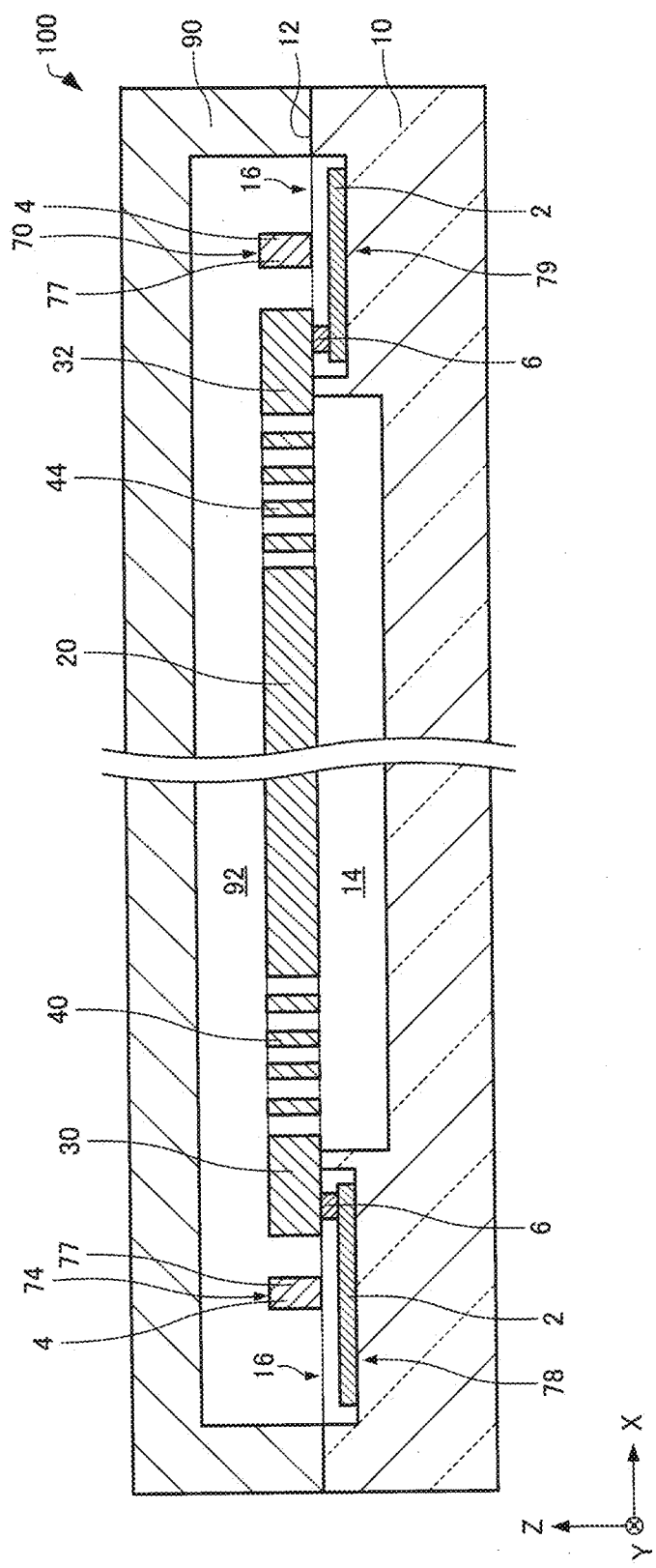
FIG. 2 is a cross-sectional view schematically showing the functional element according to the first embodiment.
Figure 3:
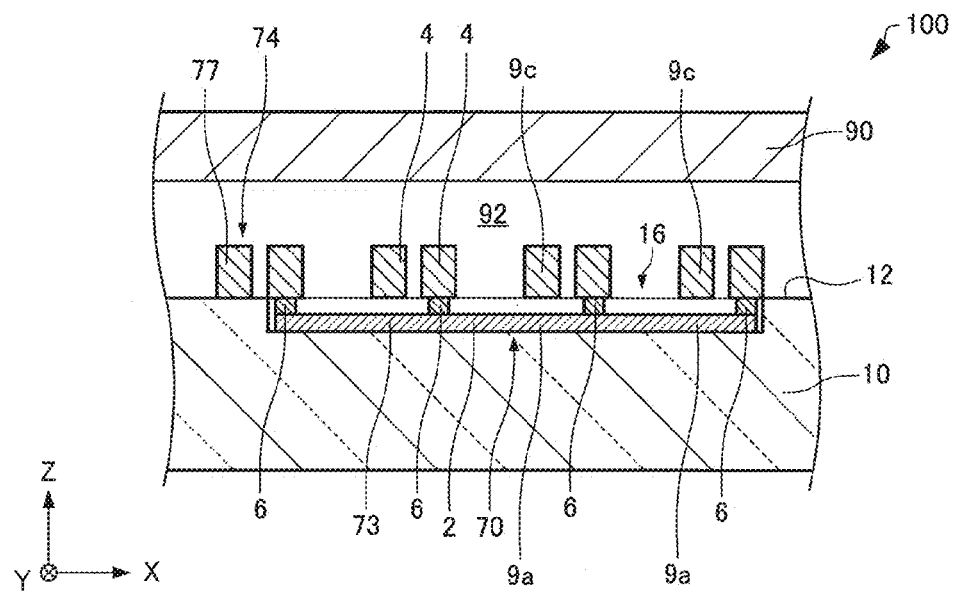
FIG. 3 is a cross-sectional view schematically showing the functional element according to the first embodiment.

Firstly, a functional element according to a first embodiment will be explained with reference to the accompanying drawings. FIG. 1 is a plan view schematically showing the functional element 100 according to the first embodiment. FIG. 2 is a cross-sectional view along the line II-II shown in FIG. 1, and schematically shows the functional element 100 according to the first embodiment. FIG. 3 is a cross-sectional view along the line III-III shown in FIG. 1, and schematically shows the functional element 100 according to the first embodiment.

It should be noted that in FIG. 1, the graphical description is presented seeing through a lid body 90 for the sake of convenience. Further, in FIGS. 1 through 3, an X axis (a first axis), a Y axis (a second axis), and a Z axis are shown as three axes perpendicular to each other.

As shown in FIGS. 1 through 3, the functional element 100 includes a substrate 10, a movable body 20, fixation sections 30, 32, connection sections 40, 44, movable electrode sections 50, 52, stationary electrode sections including first stationary electrode sections (first electrode sections) 60, second stationary electrode sections (second electrode sections) 62, third stationary electrode sections 64, and fourth stationary electrode sections 66, wiring lines 70, 74, 78, and 79, pads 80, 82, and 84, and the lid body 90. The case in which the functional element 100 is a physical quantity sensor will hereinafter be explained. Specifically, the case in which the functional element 100 is an acceleration sensor (a capacitance MEMS acceleration sensor) for detecting the acceleration in a horizontal direction (a direction along the X axis (an X-axis direction)) will be explained.

The material of the substrate 10 is, for example, glass or silicon. A recessed section 14 is formed on the upper surface (a surface facing to the +Z-axis direction) 12 of the substrate 10. Above the recessed section 14, there are disposed the movable body 20, the connection sections 40, 44, and the movable electrode sections 50, 52 via a gap. Due to the recessed section 14, the movable body 20 can move in a predetermined direction without having contact with the substrate 10. In the example shown in FIG. 1, the planar shape (the shape viewed from the Z-axis direction) of the recessed section 14 is a rectangular shape. The upper surface 12 of the substrate 10 is provided with groove sections 16. The groove sections 16 are provided with the wiring lines 70, 74, 78, and 79, and the pads 80, 82, and 84.

It should be noted that although in the example shown in FIGS. 2 and 3, the side surfaces (the surfaces of the substrate defining the recessed section 14 and the groove sections 16) of the recessed section 14 and the groove sections 16 are perpendicular to the upper surface 12, the side surfaces of the recessed section 14 and the groove sections 16 can also be tilted with respect to the upper surface 12.

The movable body 20, the fixation sections 30, 32, the connection sections 40, 44, and the movable electrode sections 50, 52 are formed integrally. The material of the movable body 20, the fixation sections 30, 32, the connection sections 40, 44, and the movable electrode sections 50, 52 is, for example, silicon provided with electrical conductivity by doping impurities such as phosphorus or boron.

The movable body 20 can be displaced along the X axis. Specifically, the movable body 20 is displaced in the X-axis direction in accordance with the acceleration in the X-axis direction while elastically deforming the connection sections 40, 44. Due to such displacement as described above, the dimensions of the gaps between the movable electrode sections 50, 52 and the stationary electrode sections 60, 62, 64, and 66 vary. Therefore, due to such displacement as described above, the amounts of the capacitances between the movable electrode sections 50, 52 and the stationary electrode sections 60, 62, 64, and 66 vary. Based on these capacitances, the functional element 100 detects the acceleration in the X-axis direction. In the example shown in FIG. 1, the planner shape of the movable body 20 is a rectangle having long sides along the X axis.

The fixation sections 30, 32 are bonded and thus fixed to the substrate 10. The first fixation section 30 is disposed on one side (the −X direction side) with respect to the recessed section 14. The second fixation section 32 is disposed on the other side (the +X direction side) with respect to the recessed section 14. The fixation sections 30, 32 supports the movable body 20 via the connection sections 40, 44. The movable body 20 is located between the fixation sections 30, 32. The fixation sections 30, 32 are disposed straddling the outer edge 15 of the recessed section 14 in a plan view (viewed from the Z-axis direction). In the example shown in the drawing, the planar shape of each of the fixation sections 30, 32 is a rectangle.

The first connection section 40 connects the movable body 20 and the first fixation section 30 to each other. The second connection section 44 connects the movable body 20 and the second fixation section 32 to each other. The connection sections 40, 44 are each configured so as to be provided with a predetermined spring constant, and allow the movable body 20 to be displaced in the X-axis direction. In the example shown in the drawing, the first connection section 40 is formed of beams 41, 42 each extending in the X-axis direction while reciprocating in the Y-axis direction. The second connection section 44 is formed of beams 45, 46 each extending in the X-axis direction while reciprocating in the Y-axis direction.

The movable electrode sections 50, 52 extend toward the respective directions opposite to each other along the second axis (the Y axis) intersecting with the first axis (the X axis). Specifically, the first movable electrode sections 50 extend from the movable body 20 in the +Y-axis direction. The second movable electrode sections 52 extend from the movable body 20 in the −Y-axis direction. The movable electrode sections 50 and the movable electrode sections 52 are each disposed so as to be arranged in the X-axis direction. In the example shown in FIG. 1, the planner shape of each of the movable electrode sections 50, 52 is a rectangle having long sides along the Y axis. The movable electrode sections 50, 52 can be displaced along the X axis due to the displacement of the movable body 20.

The stationary electrode sections 60, 62 are disposed so as to be opposed to the first movable electrode sections 50. Specifically, the first stationary electrode sections 60 are each disposed on one side (the −X-axis direction side) of the first movable electrode section 50 so as to be opposed to the first movable electrode section 50. The second stationary electrode sections 62 are each disposed on the other side (the +X-axis direction side) of the first movable electrode section 50 so as to be opposed to the first movable electrode section 50. The first stationary electrode sections 60 are fixed to the substrate 10 via the first wiring line 70. The second stationary electrode sections 62 are fixed to the substrate 10 via the second wiring line 74. In the example shown in the drawing, the planner shape of each of the movable electrode sections 60, 62 is a rectangle having long sides along the Y axis. The material of the stationary electrode sections 60, 62 is the same as the material of the movable body 20.

The stationary electrodes 64, 66 are disposed so as to be opposed to the second movable electrode sections 52. Specifically, the third stationary electrode sections 64 are each disposed on one side (the −X-axis direction side) of the second movable electrode section 52 so as to be opposed to the second movable electrode section 52. The fourth stationary electrode sections 66 are each disposed on the other side (the +X-axis direction side) of the second movable electrode section 52 so as to be opposed to the second movable electrode section 52. The third stationary electrode sections 64 are fixed to the substrate 10 via the first wiring line 70. The fourth stationary electrode sections 66 are fixed to the substrate 10 via the second wiring line 74. In the example shown in the drawing, the planner shape of each of the stationary electrode sections 64, 66 is a rectangle having long sides along the Y axis. The material of the stationary electrode sections 64, 66 is the same as the material of the movable body 20.

The electrical characteristics of the first stationary electrode sections 60, the electrical characteristics of the second stationary electrode sections 62, the electrical characteristics of the third stationary electrode sections 64, and the electrical characteristic of the fourth stationary electrode sections 66 are the same as each other. Here, the "electrical characteristics" denote the resistance and the parasitic capacitance (stray capacitance). In other words, the resistances of the stationary electrode sections 60, 62, 64, and 66 are equal to each other, and the parasitic capacitances of the stationary electrode sections 60, 62, 64, and 66 are equal to each other. In other words, the stationary electrode sections 60, 62, 64, and 66 are equal in length (size in the Y-axis direction), width (size in the X-axis direction), and thickness (size in the Z-axis direction) to each other. It should be noted that the "parasitic capacitance" denotes the capacitance component generated due to the physical structure in the functional element 100.

The first wiring line 70 is disposed on the substrate 10. In the example shown in the drawing, the first wiring line 70 is constituted by a metal section 2 formed of a metal layer, a silicon section 4 formed of a silicon layer provided with electrical conductivity by doping impurities such as phosphorus or boron, and contact sections 6 each connecting a metal section 2 and the silicon section 4 to each other. The metal section 2 is provided to the groove section 16 formed on the upper surface 12 of the substrate 10. The silicon section 4 is bonded to the upper surface 12 of the substrate 10. The material of the metal layer constituting the metal section 2 and the material of the contact section 6 is, for example, indium tin oxide (ITO), aluminum, platinum, titanium, tungsten, chromium. In the example shown in the drawing, the planar shape of the contact section 6 is a rectangle.

It should be noted that if the metal layer constituting the metal section 2 is a transparent electrode material such as ITO, it is possible to visually recognize a foreign matter existing on the metal section 2 with ease from the lower surface (the surface on the opposite side to the upper surface 12) side of the substrate 10 in the case in which the substrate 10 is transparent.

The first wiring line 70 extends from the first pad 80 disposed on the substrate 10, and then branches to be connected to the stationary electrode sections 60, 64. In the example shown in the drawing, the first wiring line 70 extends from the first pad 80 in the −Y-axis direction, then branches at a first branch section 8a (via the first branch section 8a) to extend in the −X-axis direction and the +X-axis direction, and is then connected to the stationary electrode sections 60, 64.

The first wiring line 70 includes a first part 71 between the first pad 80 and the first branch section 8a, a second part 72 between the first branch section 8a and the first stationary electrode sections 60, and a third part 73 between the first branch section 8a and the third stationary electrode sections 64.

The first part 71 of the first wiring line 70 is formed of, for example, the metal section 2. The first branch section 8a of the first wiring line 70 is a part where the first wiring line 70 extending from the first pad 80 branches into two parts. In the example shown in the drawing, the first branch section 8a is provided with the contact section 6.

The second part 72 of the first wiring line 70 is formed of, for example, the silicon section 4. In the example shown in the drawing, the second part 72 extends from the first branch section 8a in the −X-axis direction, and then branches into plural parts in accordance with the number of the first stationary electrode sections 60 to be connected to the first stationary electrode sections 60. The second part 72 is formed integrally with the first stationary electrode sections 60.

The third part 73 of the first wiring line 70 is formed of, for example, the metal section 2, the silicon section 4, and the contact sections 6. In the example shown in the drawing, in the third part 73, the silicon section 4 extends from the first branch section 8a in the +X-axis direction, further extends along the outer periphery of the recessed section 14, and is then connected to the metal section 2 via the contact section 6. The metal section 2 extends in the X-axis direction, and a plurality of silicon sections 4 extend from the metal section 2 in the +Y-axis direction in accordance with the number of the third stationary electrode sections 64. The silicon sections 4 are respectively connected to the third stationary electrode sections 64, and are formed integrally with the third stationary electrode sections 64.

In the first wiring line 70, the length (the total length of the first part 71) between the first pad 80 and the first branch section 8a is shorter than the length (the total length of the second part 72) between the first branch section 8a and the first stationary electrode sections 60. Further, the total length of the first part 71 is shorter than the length (the total length of the third part 73) between the first branch section 8a and the third stationary electrode sections 64.

The second wiring line 74 is disposed on the substrate 10. In the example shown in the drawing, the second wiring line 74 is formed of, for example, the metal section 2, the silicon section 4, and the contact sections 6. The second wiring line 74 extends from the second pad 82 disposed on the substrate 10, and then branches to be connected to the stationary electrode sections 62, 66. In the example shown in the drawing, the second wiring line 74 extends from the second pad 82 in the −Y-axis direction, then branches at a second branch section 8b (via the second branch section 8b) to extend in the −X-axis direction and the +X-axis direction, and is then connected to the stationary electrode sections 62, 66.

The second wiring line 74 includes a fourth part 75 between the second pad 82 and the second branch section 8b, a fifth part 76 between the second branch section 8b and the second stationary electrode sections 62, and a sixth part 77 between the second branch section 8b and the fourth stationary electrode sections 66.

The fourth part 75 of the second wiring line 74 is formed of, for example, the metal section 2. The second branch section 8b of the second wiring line 74 is a part where the second wiring line 74 extending from the second pad 82 branches into two parts. In the example shown in the drawing, the second branch section 8b is provided with the contact section 6.

The fifth part 76 of the second wiring line 74 is formed of, for example, the metal section 2, the silicon section 4, and the contact sections 6. In the example shown in the drawing, in the fifth part 76, the silicon section 4 extends from the second branch section 8b in the +X-axis direction, and is then connected to the metal section 2 via the contact section 6. The metal section 2 extends in the X-axis direction, and a plurality of silicon sections 4 extend from the metal section 2 in the −Y-axis direction in accordance with the number of the second stationary electrode sections 62. The silicon sections 4 are respectively connected to the second stationary electrode sections 62, and are formed integrally with the second stationary electrode sections 62.

The sixth part 77 of the second wiring line 74 is formed of, for example, the silicon section 4. In the example shown in the drawing, the sixth part 77 extends from the second branch section 8b in the −X-axis direction, further extends along the outer periphery of the recessed section 14, and then branches into plural parts in accordance with the number of the fourth stationary electrode sections 66 to be connected to the fourth stationary electrode sections 66. The sixth part 77 is formed integrally with the fourth stationary electrode sections 66.

In the second wiring line 74, the length (the total length of the fourth part 75) between the second pad 82 and the second branch section 8b is shorter than the length (the total length of the fifth part 76) between the second branch section 8b and the second stationary electrode sections 62. Further, the total length of the fourth part 75 is shorter than the length (the total length of the sixth part 77) between the second branch section 8b and the fourth stationary electrode sections 66.

The first wiring line 70 includes first intersecting sections 9a, 9b intersecting with the second wiring line 74 and a wiring line (specifically the fourth wiring line 79) other than the second wiring line 74. The first intersecting sections 9a are parts of the first wiring line 70 intersecting with the second wiring line 74. The first intersecting section 9b is a part of the first wiring line 70 intersecting with the fourth wiring line 79.

The second wiring line 74 includes second intersecting sections 9c, 9d intersecting with the first wiring line 70 and a wiring line (specifically the third wiring line 78) other than the first wiring line 70. The second intersecting sections 9c are parts of the second wiring line 74 intersecting with the first wiring line 70. The second intersecting section 9d is a part of the second wiring line 74 intersecting with the third wiring line 78.

The number of the first intersecting sections 9a, 9b and the number of the second intersecting sections 9c, 9d are equal to each other. In the example shown in the drawing, the number of the first intersecting sections 9a is six, and the number of the first intersecting section 9b is one. The number of the second intersecting sections 9c is six, and the number of the second intersecting section 9d is one.

In the first intersecting sections 9a, 9b and the second intersecting sections 9c, 9d, one of the wiring lines intersecting with each other is disposed inside the groove section 16 disposed on the substrate 10, and the other of the wiring lines intersecting with each other is disposed from a structure (specifically the silicon section 4) including silicon.

In the example shown in the drawing, in the intersecting sections 9a, 9c located on the +Y-axis direction side of the movable body 20 (in the portion overlapping the intersecting sections 9a, 9c in a planar view), the first wiring line 70 is formed of the silicon section 4 disposed on the substrate 10, and the second wiring line 74 is formed of the metal section 2 provided to the groove section 16. Specifically, the second part 72 formed of the silicon section 4 of the first wiring line 70 and the fifth part 76 formed of the metal section 2 of the second wiring line 74 intersect with each other.

Further, in the example shown in the drawing, in the intersecting sections 9a, 9c located on the −Y-axis direction side of the movable body 20 (in the portion overlapping the intersecting sections 9a, 9c in the planar view), the first wiring line 70 is formed of the metal section 2 provided to the groove section 16, and the second wiring line 74 is formed of the silicon section 4 disposed on the substrate 10. Specifically, the third part 73 formed of the metal section 2 of the first wiring line 70 and the sixth part 77 formed of the silicon section 4 of the second wiring line 74 intersect with each other.

In the planar view, the total sum of the areas (intersection areas) of the first intersecting sections 9a, 9b is equal to the total sum of the areas (intersection areas) of the second intersecting sections 9c, 9d. It is preferable that in the planar view, the intersection area between the second part 72 of the first wiring line 70 and the fifth part 76 of the second wiring line 74 is equal to the intersection area between the third part 73 of the first wiring line 70 and the sixth part 77 of the second wiring line 74.

The electrical characteristics of the first wiring line 70 and the electrical characteristics of the second wiring line 74 are equal to each other. In other words, the resistances of the wiring lines 70, 74 are equal to each other, and the parasitic capacitances of the wiring lines 70, 74 are equal to each other. In other words, the metal sections 2 respectively constituting the wiring lines 70, 74 are equal to each other in length, width, and thickness, the silicon sections 4 respectively constituting the wiring lines 70, 74 are equal to each other in length, width, and thickness, and the contact sections 6 constituting the wiring line 70 and the contact sections 6 constituting the wiring line 74 are equal to each other in the number, size, and thickness. It should be noted that if the electrical characteristics of the first wiring line 70 and the electrical characteristics of the second wiring line 74 are the same as each other, the shapes of the wiring lines 70, 74 are not particularly limited.

The second part 72 and the third part 73 of the first wiring line 70 and the fifth part 76 and the sixth part 77 of the second wiring line 74 can be point symmetrical about the center C of the movable body 20 in the planar view. In the example shown in the drawing, the wiring lines 70, 74 are disposed so as to surround the movable body 20, the fixation sections 30, 32, the connection sections 40, 44, the movable electrode sections 50, 52, and the stationary electrode sections 60, 62, 64, and 66 (hereinafter also referred to as the "movable body 20 and so on").

The third wiring line 78 is disposed on the substrate 10. The third wiring line 78 extends from the third pad 84 disposed on the substrate 10, and is then connected to the first fixation section 30. The third wiring line 78 is connected to the movable electrode sections 50, 52 via the first fixation section 30, the first connection section 40, and the movable body 20. The third wiring line 78 intersects with the second wiring line 74 in the planar view. In the example shown in the drawing, the third wiring line 78 is formed of the metal section 2 and the contact section 6. In the third wiring line 78, the metal section 2 extends from the third pad 84, and is then connected to the first fixation section 30 via the contact section 6. The metal section 2 intersects with the sixth part 77 formed of the silicon section 4 of the second wiring line 74.

A dummy wiring line (the fourth wiring line) 79 is disposed on the substrate 10. The dummy wiring line 79 is connected to the second fixation section 32. The dummy wiring line 79 intersects with the first wiring line 70 in the planar view. In the example shown in the drawing, the dummy wiring line 79 is formed of the metal section 2 and the contact section 6. In the dummy wiring line 79, the metal section 2 is connected to the second fixation section 32 via the contact section 6. The metal section 2 intersects with the third part 73 formed of the silicon section 4 of the first wiring line 70. It is preferable that the intersection area (the area of the second intersecting section 9d) between the second wiring line 74 and the third wiring line 78 is equal to the intersection area (the area of the first intersecting section 9b) between the first wiring line 70 and the dummy wiring line 79 in the planar view.

The dummy wiring line 79 is electrically connected to the third wiring line 78 via the fixation sections 30, 32, the connection sections 40, 44, and the movable body 20. Therefore, the dummy wiring line 79 can have the same electrical potential as that of the third wiring line 78. The dummy wiring line 79 is a wiring line electrically connected to the third wiring line 78 but not connected to, for example, the pads. The dummy wiring line 79 is a wiring line floating electrically.

The pads 80, 82, and 84 are disposed on the substrate 10. Specifically, the pads 80, 82, and 84 are provided to the grooves 16. In the example shown in the drawing, the pads 80, 82, and 84 are arranged in the X-axis direction. The pads 80, 82, and 84 are disposed on at positions not overlapping the lid body 90 in the planar view. In the example shown in the drawing, the planar shape of each of the pads 80, 82, and 84 is a quadrangle. The material of the pads 80, 82, and 84 is the same as, for example, the material of the metal section 2.

The lid body 90 is disposed on the substrate 10. The substrate 10 and the lid body 90 constitute a package. The substrate 10 and the lid body 90 form a cavity 92 as shown in FIGS. 2 and 3. The cavity 92 houses the movable body 20 and so on. The cavity 92 can be sealed in, for example, an inert gas (e.g., a nitrogen gas) atmosphere. The material of the lid body 90 is, for example, silicon or glass.

In the functional element 100, the capacitance between the first movable electrode sections 50 and the first stationary electrode sections 60, and the capacitance between the second movable electrode sections 52 and the third stationary electrode sections 64 can be measured using the pads 80, 84. Further, in the functional element 100, the capacitance between the first movable electrode sections 50 and the second stationary electrode sections 62, and the capacitance between the second movable electrode sections 52 and the fourth stationary electrode sections 66 can be measured using the pads 82, 84. As described above, in the functional element 100, the acceleration can be detected by separately detecting the capacitance between the movable electrode sections 50, 52 and the stationary electrode sections 60, 64 and the capacitance between the movable electrode sections 50, 52 and the stationary electrode sections 62, 66, and then performing the differential detection (using a so-called differential detection method).

It should be noted that although the case in which the functional element 100 is an acceleration sensor (the physical quantity sensor) for detecting the acceleration in the X-axis direction is hereinabove explained, the functional element according to the invention can also be an acceleration sensor for detection the acceleration in the Y-axis direction, or can also be an acceleration sensor for detecting the acceleration in a vertical direction (the Z-axis direction). Further, the functional element according to the invention is not limited to an acceleration sensor, but can also be, for example, a gyro sensor for detecting an angular velocity. Further, the functional element 100 can also be an element other than the physical quantity sensor such as a vibrator providing the element is provided with a plurality of wiring lines.

The functional element 100 has, for example, the following features.

In the functional element 100, there are included the first electrode sections 60, the second electrode sections 62, the first wiring line 70 connected to the first electrode sections 60, and the second wiring line 74 connected to the second electrode sections 62, the first wiring line 70 is provided with the first intersecting sections 9a, 9b respectively intersecting with the second wiring line 74 and the wiring line other than the second wiring line 74, the second wiring line 74 is provided with the second intersecting sections 9c, 9d respectively intersecting with the first wiring line 70 and the wiring line other than the first wiring line 70, the number of the first intersecting sections 9a, 9b and the number of the second intersecting sections 9c, 9d are equal to each other. In particular, it is the most preferable that the number of the first intersecting sections 9b where the first wiring line 70 intersects with other wiring lines than the second wiring line 74 and the number of the second intersecting sections 9d where the second wiring line 74 intersects with other wiring lines than the first wiring line 70 are equal to each other. However, even if the numbers of the intersections are not equal to each other, the difference between the number of the first intersecting sections 9b and the number of the second intersecting sections 9b preferably satisfies no higher than 50%, and more preferably satisfies no higher than 20%, with respect to larger one of the number of the first intersecting sections 9b and the number of the second intersecting sections 9d. If the ratio is higher than 50%, it is more difficult to correct the error of the parasitic capacitance with a correcting circuit. Therefore, in the functional element 100, the error of the parasitic capacitance between the wiring lines can be reduced. For example, in the case of using the functional element 100 for the capacitance detection physical quantity sensor, the capacitance generated between the first wiring line 70 and the second wiring line 74 is added roughly equally. Therefore, in the functional element 100, the parasitic capacitances of the first wiring line 70 and the second wiring line 74 can be canceled out using the so-called differential detection method, and thus the physical quantity can more accurately be detected compared to the case in which the parasitic capacitances significantly different from each other are respectively added.

In the functional element 100, in the planar view, the total sum of the intersection areas of the first intersecting sections 9a, 9b is equal to the total sum of the intersection areas of the second intersecting sections 9c, 9d. In particular, it is the most preferable that the area of the first intersecting sections 9b where the first wiring line 70 intersects with other wiring lines than the second wiring line 74 and the area of the second intersecting sections 9d where the second wiring line 74 intersects with other wiring lines than the first wiring line 70 are equal to each other. However, even if the areas of the intersections are not equal to each other, the difference between the total sum of the areas of the first intersecting sections 9b and the total sum of the areas of the second intersecting sections 9b preferably satisfies no higher than 50%, and more preferably satisfies no higher than 20%, with respect to larger one of the total sum of the areas of the first intersecting sections 9b and the total sum of the areas of the second intersecting sections 9d. If the ratio is higher than 50%, it is more difficult to correct the error of the parasitic capacitance with the correcting circuit. Therefore, in the functional element 100, the error of the parasitic capacitance between the wiring lines can be reduced. The functional element 100 can more accurately detect the physical quantity in particular as a capacitance detection physical quantity sensor.

The functional element 100 includes the movable body 20, which can be displaced along the first axis, the first movable electrode sections 50 extending from the movable body 20, and the stationary electrode sections including the first stationary electrode sections 60 as the first electrode sections respectively disposed on one side of the first movable electrode sections 50, and the second stationary electrode sections 62 as the second electrode sections disposed on the other side thereof. Thus, it is possible to make the functional element 100 function as the capacitance detection physical quantity sensor.

The functional element 100 includes the third wiring line 78 connected to the first movable electrode sections 50, and the third wiring line 78 intersects with at least one of the first wiring line 70 and the second wiring line 74. Specifically, since in the functional element 100, the second wiring line 74 connected to the stationary electrode sections 62, 66 and the third wiring line 78, which is connected to the movable electrode sections 50, 52 via the first fixation section 30, the first connection section 40, and the movable body 20, for example, are made to intersect with each other, flexibility of the wiring layout is enhanced.

The functional element 100 includes the fourth wiring line 79 electrically floating, and the fourth wiring line 79 intersects with at least one of the first wiring line 70 and the second wiring line 74. In the functional element 100, since the number of the intersections can be made equal between the first wiring line 70 and the second wiring line 74 by preparing the fourth wiring line 79 as the dummy wiring line, and making the fourth wiring line 79 intersect with at least one of the first wiring line 70 and the second wiring line 74, the physical quantity can more accurately be detected.

The functional element 100 includes the second movable electrode sections 52 extending on the opposite side to the first movable electrode sections 50, and the stationary electrode sections include the third stationary electrode sections 64 respectively disposed on one side of the second movable electrode sections 52, and the fourth stationary electrode sections 66 disposed on the other side, the first wiring line 70 is connected to the first stationary electrode sections 60 and the third stationary electrode sections 64 via the first branch section 8a, and the second wiring line 74 is connected to the second stationary electrode sections 62 and the fourth stationary electrode sections 66 via the second branch section 8b. As described above, in the functional element 100, the sensitivity can be improved by extending the movable electrode sections 50, 52 on the both sides of the movable body 20, and further, it becomes possible to dispose the wiring lines symmetrically by providing the branch sections respectively to the first wiring line 70 and the second wiring line 74, and thus, the influence of the mismatch in the electrical characteristics caused by the difference in wiring length between the first wiring line 70 and the second wiring line 74 can be reduced.

In the functional element 100, the movable body 20, the movable electrode sections 50, 52, the stationary electrode sections 60, 62, 64, and 66, the first wiring line 70, and the second wiring line 74 are disposed on the substrate 10, and in at least one of the first intersecting sections 9a, 9b and the second intersecting sections 9c, 9d, one of the wiring lines intersecting with each other is disposed inside the groove section 16 disposed on the substrate 10. Therefore, in the functional element 100, the intersecting section between the first wiring line 70 and the second wiring line 74 can easily be constituted.

In the functional element 100, the other of the wiring lines intersecting with each other is disposed with the structure including silicon. Therefore, in the functional element 100, the intersecting section between the first wiring line 70 and the second wiring line 74 can easily be constituted.

In the functional element 100, the first wiring line 70 and the second wiring line 74 is the same in electrical characteristics as each other. Therefore, the functional element 100 can perform the detection with higher accuracy.

In the functional element 100, the first wiring line 70 extends from the first pad 80, and then branches to be connected to the first stationary electrode sections 60 and the third stationary electrode sections 64, and the second wiring line 74 extends from the second pad 82, and then branches to be connected to the second stationary electrode sections 62 and the fourth stationary electrode sections 66, and the electrical characteristics of the first wiring line 70 and the electrical characteristics of the second wiring line 74 are the same. Therefore, in the functional element 100, the same parasitic capacitances are added respectively to the capacitance between the movable electrode sections 50, 52 and the stationary electrode sections 60, 64 and the capacitance between the movable electrode sections 50, 52 and the stationary electrode sections 62, 66. Therefore, in the functional element 100, the parasitic capacitances of the wiring lines 70, 74 can be canceled out using the differential detection method, and thus the physical quantity (the acceleration) can more accurately be detected compared to the case in which the parasitic capacitances different from each other are respectively added.

In the functional element 100, the electrical characteristics of the first stationary electrode sections 60, the electrical characteristics of the second stationary electrode sections 62, the electrical characteristics of the third stationary electrode sections 64, and the electrical characteristic of the fourth stationary electrode sections 66 are the same as each other. Therefore, in the functional element 100, the parasitic capacitances of the stationary electrode sections 60, 62, 64, and 66 can be canceled out using the differential detection method, and thus, the physical quantity can more accurately be detected.

In the functional element 100, the intersection area between the second part 72 branched from of the first wiring line 70 and connected to the first stationary electrode sections 60, and the fifth part 76 branched from the second wiring line 74 and connected to the second stationary electrode sections 62 is equal to the intersection area between the third part 73 branched from the first wiring line 70 and connected to the third stationary electrode sections 64, and the sixth part 77 branched from the second wiring line 74 and connected to the fourth stationary electrode sections 66. Therefore, in the functional element 100, the capacitance (the parasitic capacitance) between the wiring lines 70, 74 in the intersecting sections between the second part 72 and the fifth part 76 and the capacitance (the parasitic capacitance) between the wiring lines 70, 74 in the intersecting sections between the third part 73 and the sixth part 77 can be made equal to each other. Therefore, in the functional element 100, the physical quantity can more accurately be detected.

In the functional element 100, in the first wiring line 70, the length (the total length of the first part 71) between the first pad 80 and the first branch section 8a, is shorter than the length (the total length of the second part 72) between the first branch section 8a and the first stationary electrode sections 60, and the length (the total length of the third part 73) between the first branch section 8a and the third stationary electrode sections 64. Therefore, even if any part of the first wiring line 70 is broken, the probability of breakage of the line in the first part 71 is lower than the probability of breakage of the line in the second part 72, and is lower than the probability of breakage of the line in the third part 73. Here, although the capacitance between the movable electrode sections and the stationary electrode sections cannot be detected if the line in the first part 71 is broken, in the case in which the line is broken in either one of the second part 72 and the third part 73, the capacitance between the movable electrode sections and the stationary electrode sections can be detected using the other part. Therefore, in the functional element 100, even if any part of the first wiring line 70 is broken, the probability that the capacitance between the movable electrode sections and the stationary electrode sections can be detected is higher compared to the case in which the total length of the first part is longer than the total length of the second part and the total length of the third part.

Similarly, in the functional element 100, in the second wiring line 74, the length (the total length of the fourth part 75) between the second pad 82 and the second branch section 8b, is shorter than the length (the total length of the fifth part 76) between the second branch section 8b and the second stationary electrode sections 62, and the length (the total length of the sixth part 77) between the second branch section 8b and the fourth stationary electrode sections 66. Therefore, in the functional element 100, even if any part of the second wiring line 74 is broken, the probability that the capacitance between the movable electrode sections and the stationary electrode sections can be detected is higher compared to the case in which the total length of the fourth part is longer than the total length of the fifth part and the total length of the sixth part.

In the functional element 100, the third wiring line 78 extends from the third pad 84 to be connected to the first fixation section 30, the dummy wiring line 79 is connected to the second fixation section 32, and the intersection area between the second wiring line 74 and the third wiring line 78 is equal to the intersection area between the first wiring line 70 and the dummy wiring line 79. Therefore, in the functional element 100, the capacitance (the parasitic capacitance) between the wiring lines 74, 78 in the intersecting sections between the second wiring line 74 and the third wiring line 78 and the capacitance (the parasitic capacitance) between the wiring lines 70, 79 in the intersecting sections between the first wiring line 70 and the dummy wiring line 79 can be made equal to each other. Therefore, in the functional element 100, the physical quantity can more accurately be detected.

In the functional element 100, in the part where the wiring lines 70, 74 intersect with each other, one of the wiring lines 70, 74 is formed of the silicon section 4 disposed on the substrate 10 and the other of the wiring lines 70, 74 is formed of the metal section 2 provided to the groove section 16. Therefore, in the functional element 100, short circuit between the first wiring line 70 and the second wiring line 74 can more surely be prevented. Further, in the part where the wiring lines 70, 74 intersect with each other, it is not required to form an insulating layer between the wiring lines 70, 74, and simplification of the manufacturing process can be achieved.

In the functional element 100, the second part 72 and the third part 73 of the first wiring line 70 and the fifth part 76 and the sixth part 77 of the second wiring line 74 are point symmetrical about the center C of the movable body 20 in the planar view. Due to such a wiring layout with high symmetry, a room is created in, for example, the layout space. Therefore, for example, in the functional element 100, the largeness of the connection sections 40, 44 making a significant contribution to the sensitivity of the functional element 100 can be ensured while achieving the miniaturization, and the high sensitivity can be provided.

In the functional element 100, a part of the wiring lines 70, 74 is formed of the silicon section 4. The silicon section 4 can be provided with a larger thickness than that of the metal section 2, and a lower resistance than that of the metal section 2. Therefore, the wiring lines 70, 74 can be provided with the lower resistance compared to, for example, the wiring line wholly formed of the metal section.

In the functional element 100, the second part 72 of the first wiring line 70 extends from the first branch section 8a in the −X-axis direction, and then branches into plural parts in accordance with the number of the first stationary electrode sections 60 to be connected to the first stationary electrode sections 60. Since the second part 72 is formed of the silicon section 4, it is not required to provide a plurality of contact sections 6 in order to be connected to the plurality of first stationary electrode sections 60 in the second part 72. Therefore, the number of the contact sections 6 can be reduced in the first wiring line 70.

Similarly, in the functional element 100, the sixth part 77 of the second wiring line 74 extends from the second branch section 8b in the −X-axis direction, further extends along the outer periphery of the recessed section 14, and then branches into plural parts in accordance with the number of the fourth stationary electrode sections 66 to be connected to the fourth stationary electrode sections 66. Since the sixth part 77 is formed of the silicon section 4, it is not required to provide a plurality of contact sections 6 in order to be connected to the plurality of fourth stationary electrode sections 66 in the sixth part 77. Therefore, the number of the contact sections 6 can be reduced in the second wiring line 74.

As described above, in the functional element 100, since the number of the contact sections 6 in the wiring lines 70, 74 can be reduced, the possibility of the contact failure can be reduced. In particular, in the case of achieving the miniaturization in the physical quantity sensor, the area of the contact sections decreases in the planar view, and the contact failure easily occurs.

1.2. Method of Manufacturing Functional Element

Figure 4:
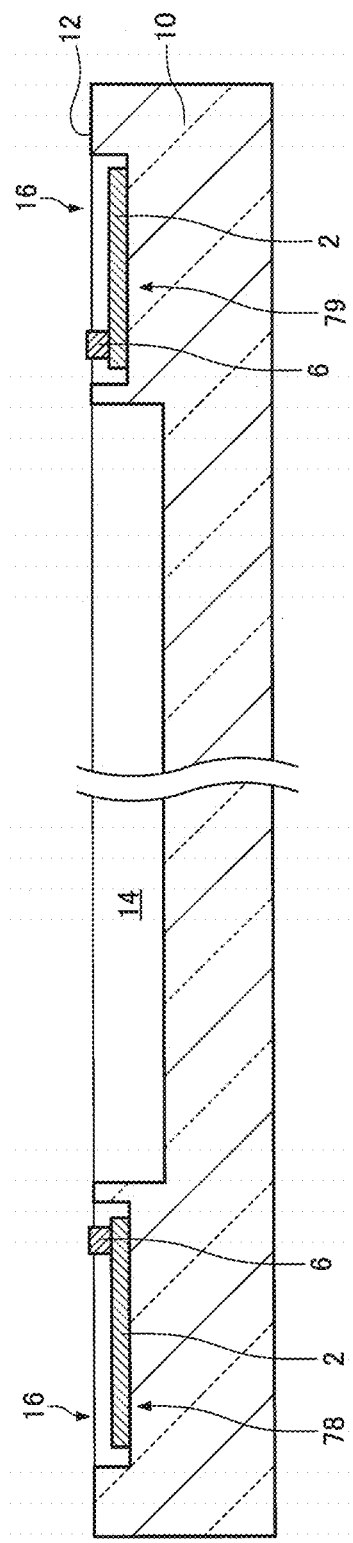
FIG. 4 is a cross-sectional view schematically showing a manufacturing process of the functional element according to the first embodiment.
Figure 5:
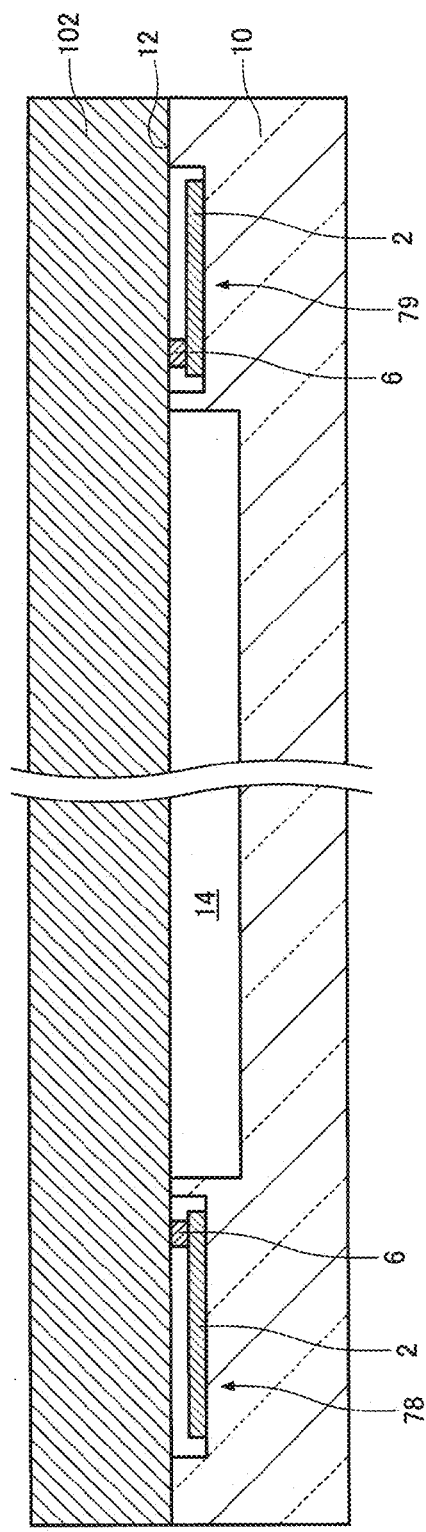
FIG. 5 is a cross-sectional view schematically showing the manufacturing process of the functional element according to the first embodiment.
Figure 6:
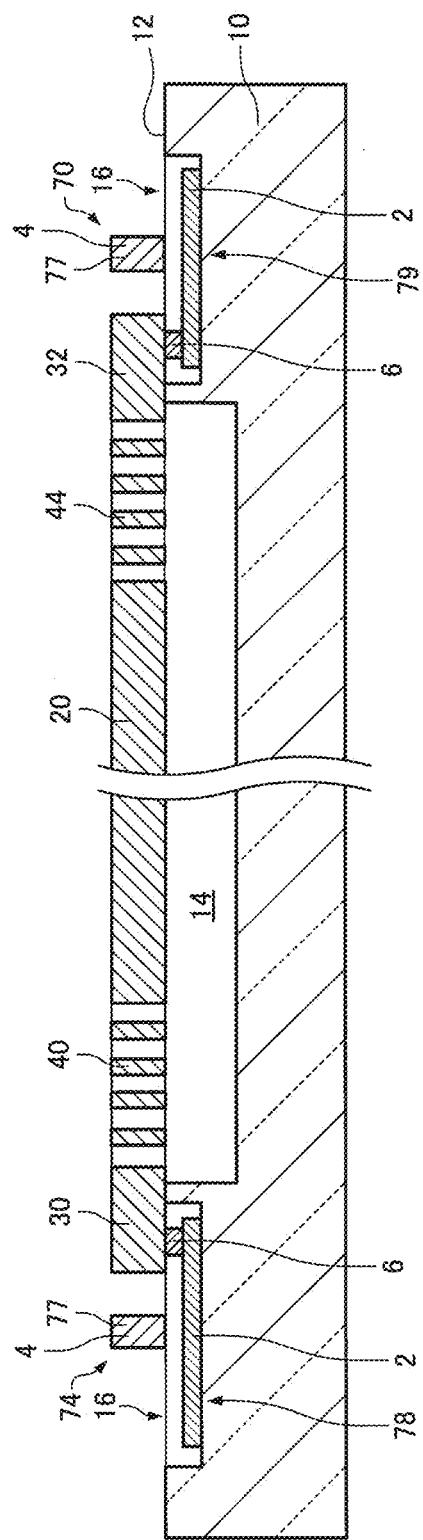
FIG. 6 is a cross-sectional view schematically showing the manufacturing process of the functional element according to the first embodiment.

Then, a method of manufacturing the functional element according to the first embodiment will be explained with reference to the accompanying drawings. FIGS. 4 through 6 are cross-sectional views schematically showing the manufacturing process of the functional element 100 according to the first embodiment, and each correspond to FIG. 2.

As shown in FIG. 4, patterning is performed on, for example, a glass substrate (specifically, patterning is performed using photolithography and etching) to form the recessed section 14 and the groove sections 16. According to the present process, the substrate 10 provided with the recessed section 14 and the groove sections 16 can be obtained.

Then, the metal section 2 is provided to the groove sections 16, the contact sections 6 are formed on the metal section 2. Subsequently, the pads 80, 82, and 84 are provided to the groove sections 16 (see FIG. 1). The metal section 2, the contact sections 6, and the pads 80, 82, and 84 are formed by deposition using, for example, a sputtering method or a chemical vapor deposition (CVD) method, and patterning. According to the present process, the wiring lines 78, 79 can be formed.

It should be noted that the contact sections 6 are preferably formed so as to protrude upward from the upper surface 12 of the substrate 10. Thus, it is possible to make the contact sections 6 surely have contact with the silicon section 4.

As shown in FIG. 5, a silicon substrate 102, for example, is bonded to the substrate 10. Bonding between the substrate 10 and the silicon substrate 102 is achieved by, for example, anodic bonding. Thus, the substrate 10 and the silicon substrate 102 can firmly be bonded to each other.

As shown in FIG. 6, the movable body 20, the fixation sections 30, 32, the connection sections 40, 44, and the movable electrode sections 50, 52 are formed integrally by grinding the silicon substrate 102 using, for example, a grinding machine to form a thin film, and then patterning it into a predetermined shape. Further, in the present process, the stationary electrode sections 60, 62, 64, and 66 and the silicon section 4 are formed integrally. According to the present process, the wiring lines 70, 74 can be formed. The etching in patterning in the present process can also be performed using a Bosch method.

As shown in FIG. 2, the lid body 90 is bonded to the substrate 10 to thereby house the movable body 20 and so on in the cavity 92 formed by the substrate 10 and the lid body 90. Bonding between the substrate 10 and the lid body 90 is achieved by, for example, anodic bonding. Thus, the substrate 10 and the lid body 90 can firmly be bonded to each other. By performing the present process in an inert gas atmosphere, it is possible to fill the cavity 92 with the inert gas.

According to the process described hereinabove, the functional element 100 can be manufactured.

2. Second Embodiment

2.1. Functional Element

Figure 7:
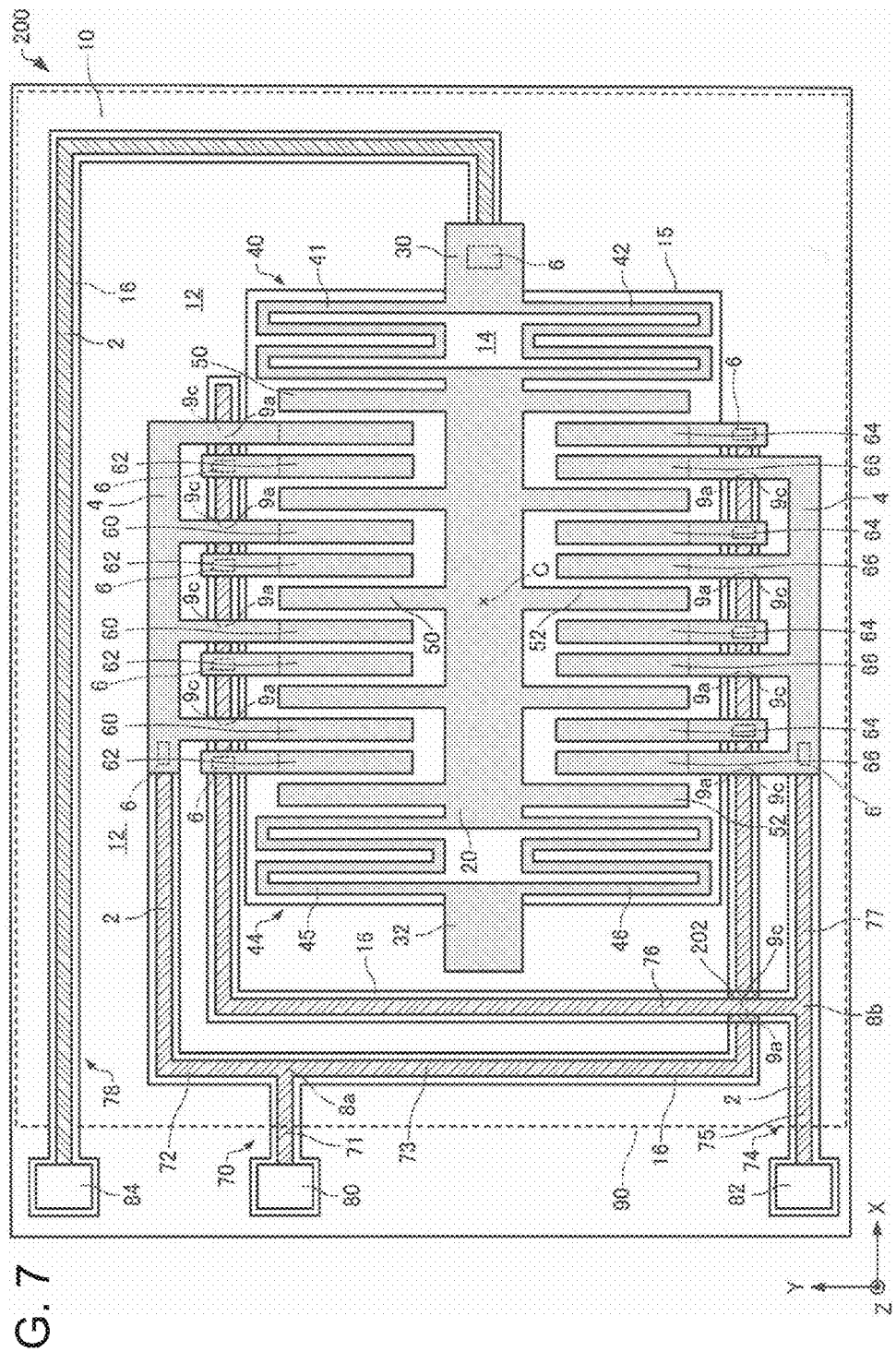
FIG. 7 is a plan view schematically showing a functional element according to a second embodiment of the invention.

Then, a functional element according to a second embodiment will be explained with reference to the accompanying drawing. FIG. 7 is a plan view schematically showing the functional element 200 according to the second embodiment.

It should be noted that in FIG. 7, the graphical description is presented seeing through the lid body 90 for the sake of convenience. Further, in FIG. 7, the X axis (the first axis), the Y axis (the second axis), and the Z axis are shown as three axes perpendicular to each other. Hereinafter, in the functional element 200, members having the same functions as those of the constituents of the functional element 100 described above will be denoted with the same reference symbols, and detailed explanation thereof will be omitted.

As shown in FIG. 1, in the functional element 100, the first fixation section 30 is disposed on the −X direction side of the recessed section 14, and the second fixation section 32 is disposed on the +X direction side of the recessed section 14. In contrast, as shown in FIG. 7, in the functional element 200, the first fixation section 30 is disposed on the +X direction side of the recessed section 14, and the second fixation section 32 is disposed on the −X direction side of the recessed section 14. Further, the functional element 200 is different in the shapes of the wiring lines 70, 74 from the functional element 100. Further, the functional element 200 does not have the dummy wiring line 79 unlike the functional element 100.

In the functional element 200, the first wiring line 70 extends from the first pad 80 in the +X-axis direction, and then branches to extend in the +Y-axis direction and the −Y-axis direction. The pads 80, 82, and 84 are arranged in the Y-axis direction.

The first part 71 of the first wiring line 70 is formed of, for example, the metal section 2. The first part 71 extends from the first pad 80 to the first branch section 8a.

The second part 72 of the first wiring line 70 is formed of, for example, the metal section 2, the silicon section 4, and the contact section 6. In the second part 72, the metal section 2 extends from the first branch section 8a in the +Y-axis direction, further extends in the +X-axis direction, and is then connected to the silicon section 4 via the contact section 6. The silicon section 4 is connected to the first stationary electrode sections 60.

The third part 73 of the first wiring line 70 is formed of, for example, the metal section 2, the silicon section 4, and the contact sections 6. In the third part 73, the metal section 2 extends from the first branch section 8a in the −Y-axis direction, further extends in the +X-axis direction, and is then connected to the silicon section 4 via the contact section 6. The silicon section 4 is connected to the third stationary electrode sections 64.

In the functional element 200, the second wiring line 74 extends from the second pad 82 in the +X-axis direction, and then branches to extend in the +Y-axis direction and the +X-axis direction.

The fourth part 75 of the second wiring line 74 is formed of, for example, the metal section 2. The fourth part 75 extends from the second pad 82 to the second branch section 8b.

The fifth part 76 of the second wiring line 74 is formed of, for example, the metal section 2, the silicon section 4, and the contact sections 6. In the fifth part 76, the metal section 2 extends from the second branch section 8b in the +X-axis direction, further extends in the +Y-axis direction, and is then connected to the silicon section 4 via the contact section 6. The silicon section 4 is connected to the second stationary electrode sections 62.

The sixth part 77 of the second wiring line 74 is formed of, for example, the metal section 2, the silicon section 4, and the contact section 6. In the sixth part 77, the metal section 2 extends from the second branch section 8b in the +X-axis direction, and is then connected to the silicon section 4 via the contact section 6. The silicon section 4 is connected to the fourth stationary electrode sections 66.

The third part 73 of the first wiring line 70 and the fifth part 76 of the second wiring line 74 intersect with each other. In the example shown in the drawing, in the intersecting section between the third part 73 and the fifth part 76, an insulating layer 202 is disposed on the metal section 2 constituting the third part 73, and the metal section 2 constituting the fifth part 76 is disposed on the insulating layer 202. Thus, short circuit between the first wiring line 70 and the second wiring line 74 can be prevented. The material of the insulating layer 202 is, for example, silicon oxide or silicon nitride. It should be noted that although not shown in the drawings, the insulating layer 202 is disposed on the fifth part 76, and the third part 73 can be disposed on the insulating layer 202.

In the functional element 200, the physical quantity can accurately be detected similarly to the functional element 100.

2.2. Method of Manufacturing Functional Element

Then, a method of manufacturing the functional element according to the second embodiment will be explained with reference to the accompanying drawings.

As shown in FIG. 7, in the method of manufacturing the functional element 200 according to the second embodiment, the insulating layer 202 is formed on the third part 73 of the first wiring line 70. The insulating layer 202 is formed by deposition using, for example, a CVD method and patterning.

Besides the above, the method of manufacturing the functional element 200 according to the second embodiment is basically the same as the method of manufacturing the functional element 100 according to the first embodiment. Therefore, the explanations thereof will be omitted.

2.3. Modified Example of Functional Element

Figure 8:
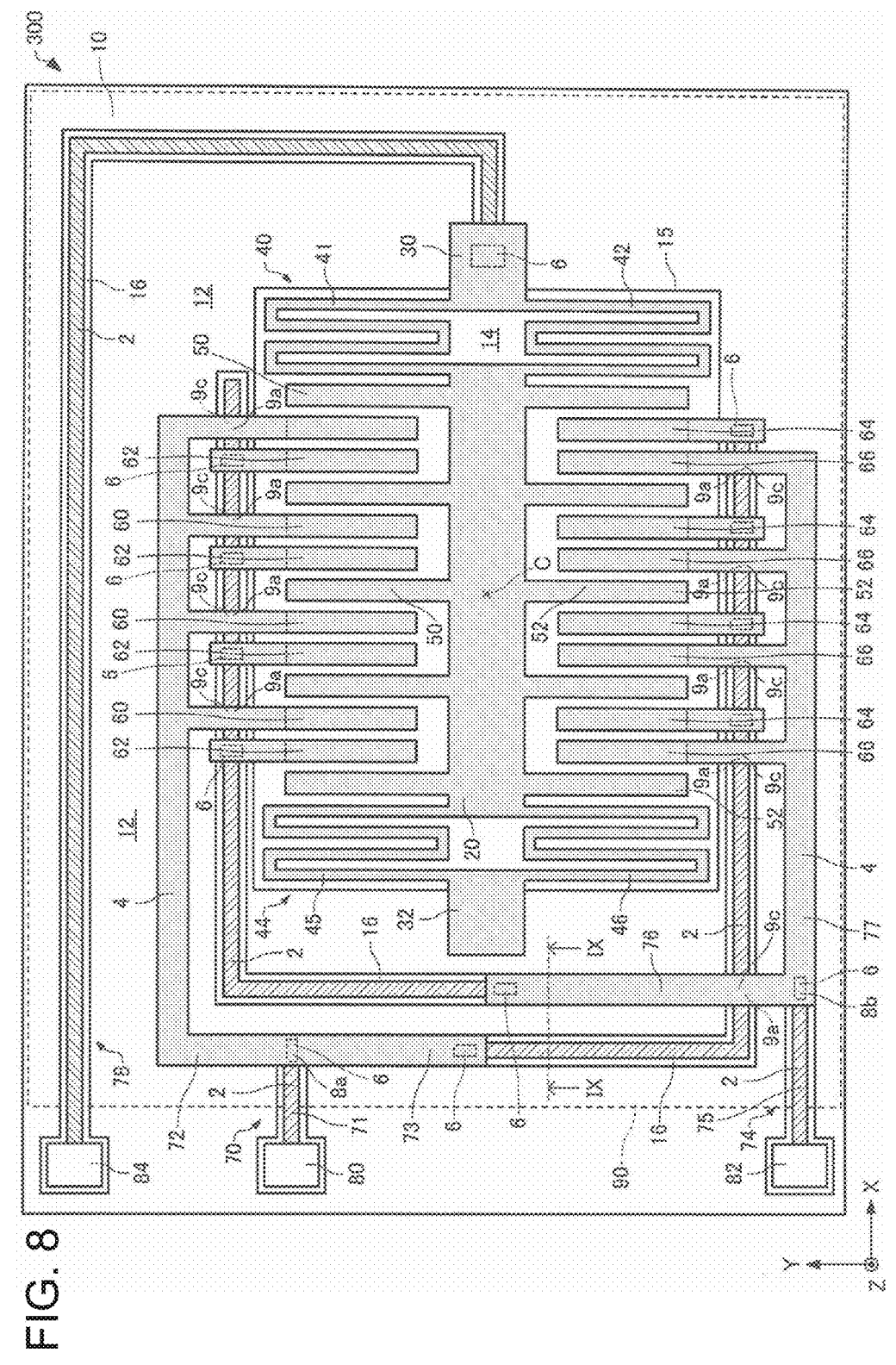
Figure 9:
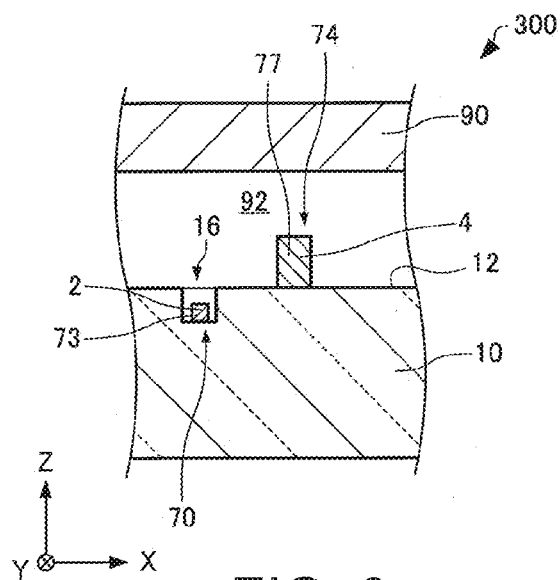
FIG. 9 is a cross-sectional view schematically showing the functional element according to the modified example of the second embodiment.

Then, a functional element according to a modified example of the second embodiment will be explained with reference to the accompanying drawings. FIG. 8 is a plan view schematically showing the functional element 300 according to the modified example of the second embodiment. FIG. 9 is a cross-sectional view along the IX-IX line shown in FIG. 8, and schematically shows the functional element 300 according to the modified example of the second embodiment.

It should be noted that in FIG. 8, the graphical description is presented seeing through the lid body 90 for the sake of convenience. Further, in FIGS. 8 and 9, the X axis (the first axis), the Y axis (the second axis), and the Z axis are shown as three axes perpendicular to each other. Hereinafter, in the functional element 300, members having the same functions as those of the constituents of the functional elements 100, 200 described above will be denoted with the same reference symbols, and detailed explanation thereof will be omitted.

As shown in FIG. 7, in the functional element 200, in the intersecting section between the first wiring line 70 and the second wiring line 74, the insulating layer 202 is disposed on the metal section 2 constituting the third part 73 of the first wiring line 70, and the metal section 2 constituting the fifth part 76 of the second wiring line 74 is disposed on the insulating layer 202.

In contrast, in the functional element 300, as shown in FIG. 8, in the intersecting section between the first wiring line 70 and the second wiring line 74, the third part 73 of the first wiring line 70 is the metal section 2 provided to the groove section 16, and the fifth part 76 of the second wiring line 74 is the silicon section 4 disposed on the substrate 10. Thus, short circuit between the first wiring line 70 and the second wiring line 74 can be prevented without forming the insulating layer 202.

In the functional element 300, the second part 72 of the first wiring line 70 and the sixth part 77 of the second wiring line 74 are formed of, for example, the silicon section 4. The third part 73 of the first wiring line 70 and the fifth part 76 of the second wiring line 74 are formed of, for example, the metal section 2, the silicon section 4, and the contact sections 6.

In the third part 73 of the first wiring line 70, the silicon section 4 extends from the first branch section 8a in the −Y-axis direction, and is then connected to the metal section 2 via the contact section 6. The metal section 2 extends in the −Y-axis direction, further extends in the +X-axis direction, and is then connected to the silicon section 4 via the contact section 6. The silicon section 4 is connected to the third stationary electrode sections 64.

In the fifth part 76 of the second wiring line 74, the silicon section 4 extends from the second branch section 8b in the +Y-axis direction, and is then connected to the metal section 2 via the contact section 6. The metal section 2 extends in the +Y-axis direction, further extends in the +X-axis direction, and is then connected to the silicon section 4 via the contact section 6. The silicon section 4 is connected to the second stationary electrode sections 62.

As shown in FIGS. 8 and 9, in the functional element 300, in the parts of the wiring lines 70, 74 disposed in parallel to each other, one of the wiring lines 70, 74 is the silicon section 4 (a silicon layer) disposed on the substrate 10 and the other of the wiring lines 70, 74 is the metal section 2 (a metal layer) provided to the groove section 16. Here, the "parts disposed in parallel to each other" are the parts of the wiring lines 70, 74 between which the movable body 20 or the like and any other wiring line do not exist, and in which the wiring lines 70, 74 extend in parallel to each other. In the example shown in the drawings, the "parts disposed in parallel to each other" are the part of the third part 73 of the first wiring line 70 extending in the Y-axis direction, and the part of the fifth part 76 of the second wiring line 74 extending in the Y-axis direction.

In the functional element 300, the first wiring line 70 and the second wiring line 74 are provided with the parts disposed in parallel to each other, and in the parts disposed in parallel to each other, one of the first wiring line 70 and the second wiring line 74 is disposed inside the groove section 16. Therefore, in the functional element 300, the parasitic capacitance between the part of the third part 73 of the first wiring line 70 extending in the Y-axis direction, and the part of the fifth part 76 of the second wiring line 74 extending in the Y-axis direction can be reduced. For example, in the case in which the both wiring lines are the silicon sections formed on the substrate or the metal sections provided to the groove section in the "parts disposed in parallel to each other," the parasitic capacitance between the both wiring lines increases.

3. Third Embodiment

Then, electronic apparatuses according to a third embodiment will be explained with reference to the accompanying drawings. The electronic apparatuses according to the third embodiment each include the functional element according to the invention. Hereinafter, the electronic apparatuses including the functional element 100 as the functional element according to the invention will be explained.

Figure 10:
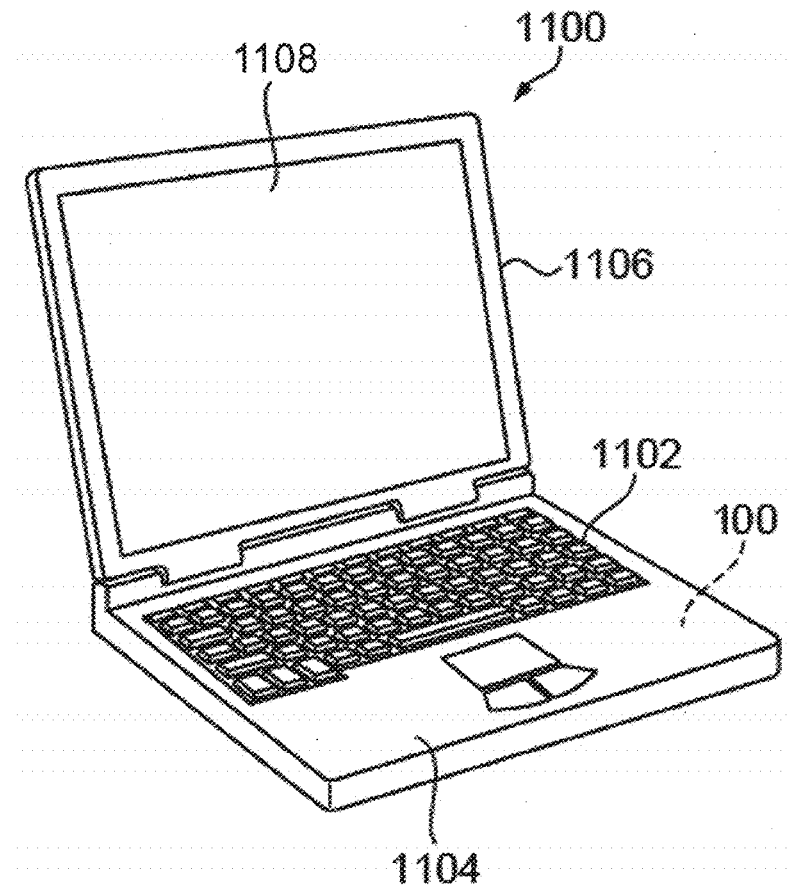
FIG. 10 is a perspective view schematically showing an electronic apparatus according to a third embodiment of the invention.

FIG. 10 is a perspective view schematically showing a mobile type (or laptop type) personal computer 1100 as the electronic apparatus according to the third embodiment.

As shown in FIG. 10, the personal computer 1100 is composed of a main body section 1104 equipped with a keyboard 1102, and a display unit 1106 equipped with a display section 1108, and the display unit 1106 is pivotally supported with respect to the main body section 1104 via a hinge structure.

Such a personal computer 1100 incorporates the functional element 100.

Figure 11:
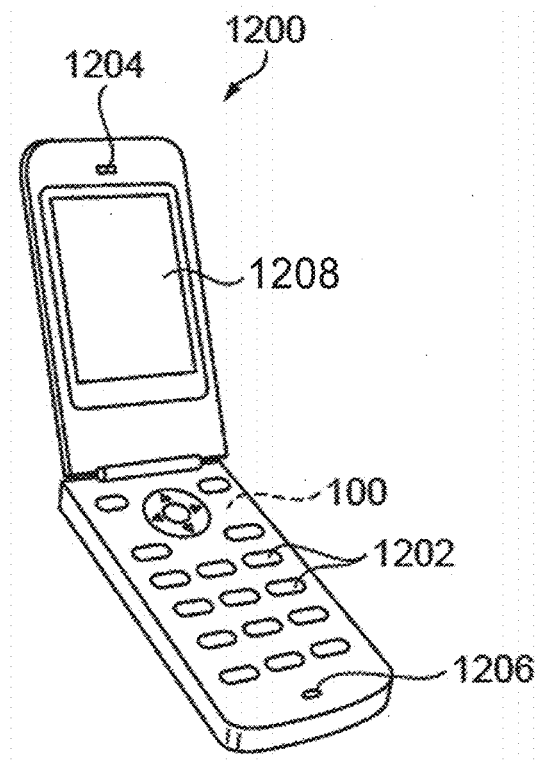
FIG. 11 is a perspective view schematically showing an electronic apparatus according to the third embodiment.

FIG. 11 is a perspective view schematically showing a cellular phone (including PHS) 1200 as the electronic apparatus according to the third embodiment.

As shown in FIG. 11, the cellular phone 1200 is provided with a plurality of operation buttons 1202, an ear piece 1204, and a mouthpiece 1206, and a display section 1208 is disposed between the operation buttons 1202 and the ear piece 1204.

Such a cellular phone 1200 incorporates the functional element 100.

Figure 12:
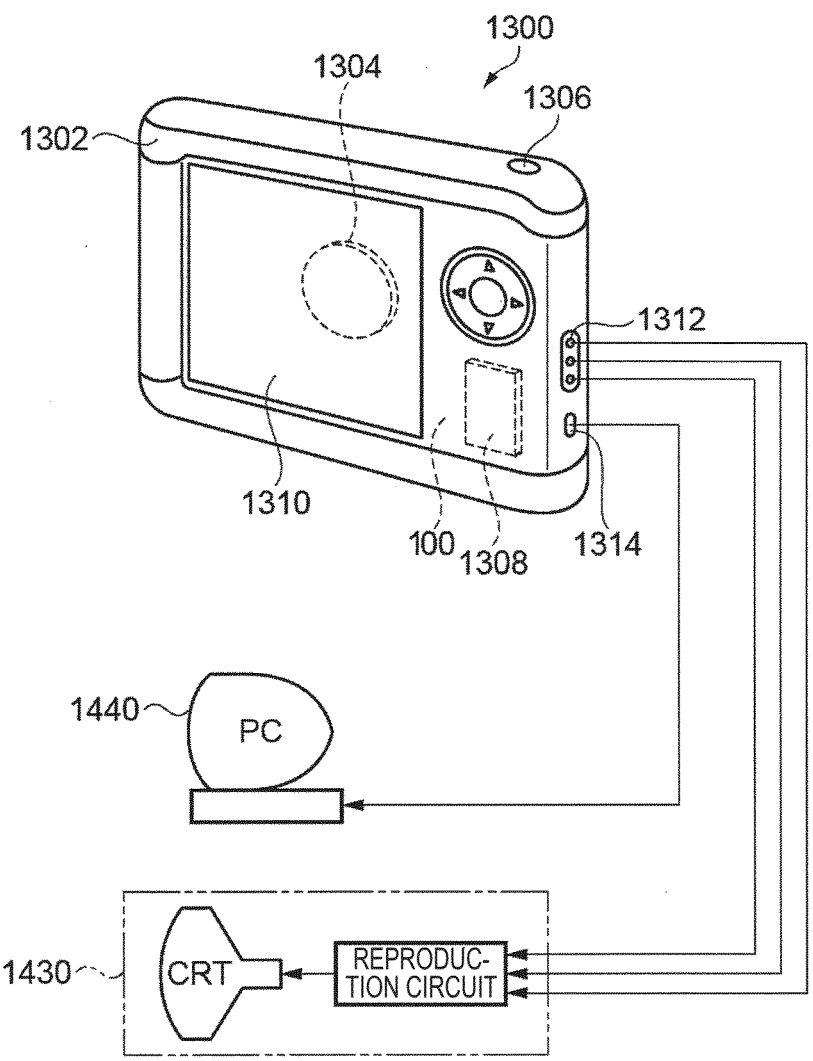
FIG. 12 is a perspective view schematically showing an electronic apparatus according to the third embodiment.

FIG. 12 is a perspective view schematically showing a digital still camera 1300 as the electronic apparatus according to the third embodiment. It should be noted that FIG. 12 also shows the connection with external equipment schematically.

Here, typical cameras expose silver salt films to optical images of objects, while the digital still camera 1300 performs photoelectric conversion on optical images of objects by imaging elements such as CCD (charge coupled device) to generate imaging signals (image signals).

The case (body) 1302 of the digital still camera 1300 is provided with a display section 1310 disposed on the back surface thereof to have a configuration of performing display in accordance with the imaging signal from the CCD, wherein the display section 1310 functions as a viewfinder for displaying the objects as electronic images.

Further, the front surface (the back side in the drawing) of the case 1302 is provided with a light receiving unit 1304 including an optical lens (an imaging optical system), the CCD, and so on.

When the photographer checks an object image displayed on the display section 1310, and then holds down a shutter button 1306, the imaging signal from the CCD at that moment is transferred to and stored in a memory device 1308.

Further, the digital still camera 1300 is provided with video signal output terminals 1312 and an input-output terminal 1314 for data communication disposed on a side surface of the case 1302. Further, a television monitor 1430 and a personal computer 1440 are connected to the video signal output terminals 1312 and the input-output terminal 1314 for data communication, respectively, according to needs. Further, there is adopted the configuration in which the imaging signal stored in the memory device 1308 is output to the television monitor 1430 and the personal computer 1440 in accordance with a predetermined operation.

Such a digital still camera 1300 incorporates the functional element 100.

Since such electronic apparatuses 1100, 1200, and 1300 as described above each include the functional element 100, in the case of using the functional element 100 as the capacitance detection physical quantity sensor, the physical quantity can accurately be detected.

It should be noted that, in addition to the personal computer (the mobile personal computer) shown in FIG. 10, the cellular phone shown in FIG. 11, and the digital still camera shown in FIG. 12, as the electronic apparatus equipped with the functional element 100 described above, there can be cited, for example, an inkjet ejection device (e.g., an inkjet printer), a laptop personal computer, a television set, a video camera, a video cassette recorder, a variety of types of car navigation system, a pager, a personal digital assistance (including one with communication function), an electronic dictionary, an electric calculator, a computerized game machine, a head-mounted display, a word processor, a workstation, a video phone, a security video monitor, a pair of electronic binoculars, a POS terminal, a medical instrument (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, a rocket, or a ship), a posture control system for a robot or a human body, and a flight simulator.

4. Fourth Embodiment

Then, a moving object according to a fourth embodiment will be explained with reference to the accompanying drawings. The moving object according to the fourth embodiment includes the physical quantity sensor according to the invention. Hereinafter, the moving object including the functional element 100 as the physical quantity sensor according to the invention will be explained.

Figure 13:
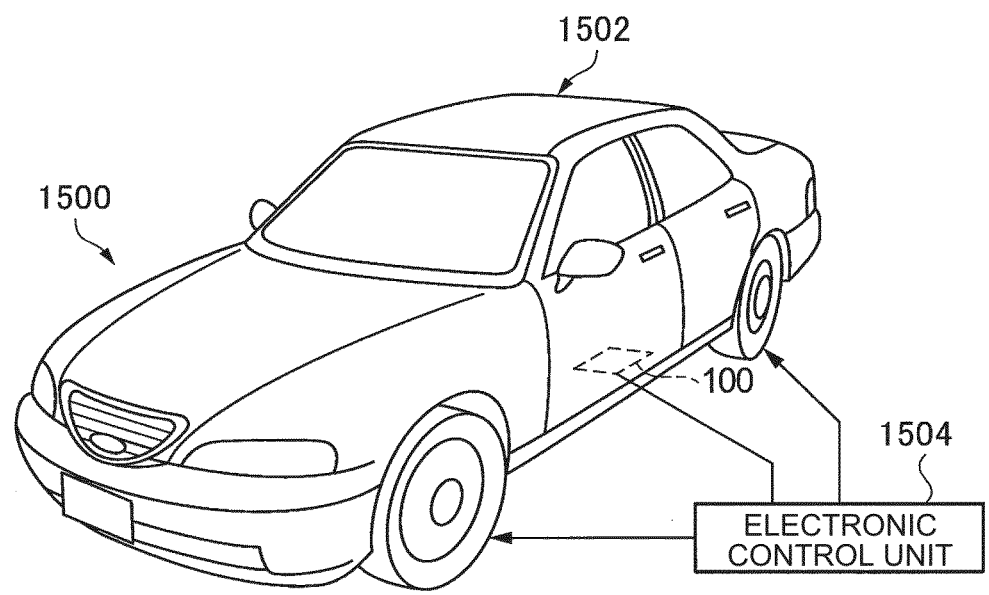
FIG. 13 is a perspective view schematically showing a moving object according to a fourth embodiment of the invention.

FIG. 13 is a perspective view schematically showing a vehicle 1500 as the moving object according to the fourth embodiment.

The vehicle 1500 incorporates the functional element 100. Specifically, as shown in FIG. 13, a body 1502 of the vehicle 1500 is equipped with an electronic control unit (ECU) 1504 incorporating the functional unit 100 for detecting the acceleration of the vehicle 1500 to control the output of the engine. Further, the functional element 100 can widely be applied to a vehicle posture control unit, an antilock brake system (ABS), an air-bag system, and a tire pressure monitoring system (TPMS) besides the above.

Since the vehicle 1500 includes the functional element 100, in the case of using the functional element 100 as the capacitance detection physical quantity sensor, the physical quantity can accurately be detected.

The embodiments and the modified example described above are illustrative only, and the invention is not limited to the embodiments and the example. For example, it is also possible to arbitrarily combine the embodiments and the modified example described above with each other.

The invention includes configurations (e.g., configurations having the same function, the same way, and the same result, or configurations having the same object and the same advantages) substantially the same as the configuration described as the embodiments of the invention. Further, the invention includes configurations obtained by replacing a non-essential part of the configuration described as the embodiments of the invention. Further, the invention includes configurations exerting the same functional effects and configurations capable of achieving the same object as the configuration described as the embodiments of the invention. Further, the invention includes configurations obtained by adding known technologies to any of the configurations described as the embodiments of the invention.

What is claimed is:

1. A functional element comprising:
a first electrode section;
a second electrode section;
a first wiring line connected to the first electrode section; and
a second wiring line connected to the second electrode section,
wherein the first wiring line is provided with at least one first intersecting section intersecting with a wiring line other than the second wiring line,
the second wiring line is provided with at least one second intersecting section intersecting with a wiring line other than the first wiring line, and
the first intersecting sections and the second intersecting sections are configured such that one of the following conditions is satisfied:
a number of the first intersecting sections is same as a number of the second intersecting sections, and
a difference between the number of the first intersecting sections and the number of the second intersecting sections satisfies a condition one of equal to and lower than 50% with respect to larger one of the number of the first intersecting sections and the number of the second intersecting sections.

2. The functional element according to claim 1, wherein a difference between a total sum of intersection areas of the first intersecting sections and a total sum of intersection areas of the second intersecting sections satisfies a condition one of equal to and lower than 50% with respect to larger one of the total sum of the intersection areas of the first intersecting sections and the total sum of the intersection areas of the second intersecting sections in a planar view.

3. The functional element according to claim 1, wherein the number of the first intersecting sections and the number of the second intersecting sections are equal to each other.

4. A functional element comprising:
a first electrode section;
a second electrode section;
a first wiring line connected to the first electrode section; and
a second wiring line connected to the second electrode section,
wherein the first wiring line is provided with at least one first intersecting section intersecting with a wiring line other than the second wiring line,
the second wiring line is provided with at least one second intersecting section intersecting with a wiring line other than the first wiring line, and
the first intersecting sections and the second intersecting sections are configured such that one of following conditions is satisfied:
a total sum of intersection areas of the first intersecting sections is same as a total sum of intersection areas of the second intersecting sections, and
a difference between the total sum of intersection areas of the first intersecting sections and the total sum of intersection areas of the second intersecting sections satisfies a condition one of equal to and lower than 50% with respect to larger one of the total sum of the intersection areas of the first intersecting sections and the total sum of the intersection areas of the second intersecting sections in a planar view.

5. The functional element according to claim 4, wherein the total sum of the intersection areas of the first intersecting sections is equal to the total sum of the intersection areas of the second intersecting sections.

6. The functional element according to claim 5, wherein a number of the first intersecting sections and a number of the second intersecting sections are equal to each other.

7. The functional element according to claim 1, further comprising:
a movable body, which can be displaced along a first axis;
a first movable electrode section extending from the movable body; and
a stationary electrode section including a first stationary electrode section as a first electrode section disposed on one side of the first movable electrode section, and a second stationary electrode section as a second electrode section disposed on the other side.

8. The functional element according to claim 7, further comprising:
a third wiring line connected to the first movable electrode section,
wherein the third wiring line intersects with at least one of the first wiring line and the second wiring line.

9. The functional element according to claim 7, further comprising:
a fourth wiring line floating electrically,
wherein the fourth wiring line intersects with at least one of the first wiring line and the second wiring line.

10. The functional element according to claim 7, further comprising:
a second movable electrode section extending on an opposite side to the first movable electrode section,
wherein the stationary electrode section includes a third stationary electrode section disposed on one side of the second movable electrode section, and a fourth stationary electrode section disposed on the other side,
the first wiring line is connected to the first stationary electrode section and the third stationary electrode section via a first branch section, and
the second wiring line is connected to the second stationary electrode section and the fourth stationary electrode section via a second branch section.

11. The functional element according to claim 7, wherein the movable body, the movable electrode section, the stationary electrode section, the first wiring line, and the second wiring line are disposed on a substrate, and
in at least one of the first intersecting section and the second intersecting section, one of the wiring lines intersecting with each other is disposed inside a groove disposed on the substrate.

12. The functional element according to claim 11, wherein the other of the wiring lines intersecting with each other is disposed with a structure including silicon.

13. The functional element according to claim 7, wherein the first wiring line and the second wiring line are provided with parts disposed in parallel to each other, and
in the parts disposed in parallel to each other, one of the first wiring line and the second wiring line is disposed inside a groove disposed on the substrate.

14. The functional element according to claim 1, wherein the first wiring line and the second wiring line are the same in electrical characteristics as each other.

15. An electronic apparatus comprising:
the functional element according to claim 1.

16. A moving object comprising:
the functional element according to claim 1.

17. The functional element according to claim 4, further comprising:
a movable body, which can be displaced along a first axis;
a first movable electrode section extending from the movable body; and
a stationary electrode section including a first stationary electrode section as a first electrode section disposed on one side of the first movable electrode section, and a second stationary electrode section as a second electrode section disposed on the other side.

18. The functional element according to claim 17, further comprising:
a third wiring line connected to the first movable electrode section,
wherein the third wiring line intersects with at least one of the first wiring line and the second wiring line.

19. The functional element according to claim 17, further comprising:
a fourth wiring line floating electrically,
wherein the fourth wiring line intersects with at least one of the first wiring line and the second wiring line.

20. The functional element according to claim 17, further comprising:
a second movable electrode section extending on an opposite side to the first movable electrode section,
wherein the stationary electrode section includes a third stationary electrode section disposed on one side of the second movable electrode section, and a fourth stationary electrode section disposed on the other side,
the first wiring line is connected to the first stationary electrode section and the third stationary electrode section via a first branch section, and the second wiring line is connected to the second stationary electrode section and the fourth stationary electrode section via a second branch section.

21. The functional element according to claim 17, wherein
the movable body, the movable electrode section, the stationary electrode section, the first wiring line, and the second wiring line are disposed on a substrate, and
in at least one of the first intersecting section and the second intersecting section, one of the wiring lines intersecting with each other is disposed inside a groove disposed on the substrate.

22. The functional element according to claim 21, wherein
the other of the wiring lines intersecting with each other is disposed with a structure including silicon.

23. The functional element according to claim 17, wherein
the first wiring line and the second wiring line are provided with parts disposed in parallel to each other, and
in the parts disposed in parallel to each other, one of the first wiring line and the second wiring line is disposed inside a groove disposed on the substrate.

24. The functional element according to claim 4, wherein
the first wiring line and the second wiring line are the same in electrical characteristics as each other.

25. An electronic apparatus comprising:
the functional element according to claim 4.

26. A moving object comprising:
the functional element according to claim 4.

* * * * *